(12) United States Patent
Samsonidze et al.

(10) Patent No.: US 10,439,121 B2
(45) Date of Patent: Oct. 8, 2019

(54) MATERIALS FOR THERMOELECTRIC ENERGY CONVERSION

(71) Applicant: Robert Bosch GmbH, Stuttgart (DE)

(72) Inventors: Georgy Samsonidze, Dorchester, MA (US); Boris Kozinsky, Waban, MA (US)

(73) Assignee: Robert Bosch GmbH, Stuttgart (DE)

( * ) Notice: Subject to any disclaimer, the term of this patent is extended or adjusted under 35 U.S.C. 154(b) by 498 days.

(21) Appl. No.: 15/101,116

(22) PCT Filed: Dec. 4, 2014

(86) PCT No.: PCT/US2014/068588
§ 371 (c)(1),
(2) Date: Jun. 2, 2016

(87) PCT Pub. No.: WO2015/130364
PCT Pub. Date: Sep. 3, 2015

(65) Prior Publication Data
US 2016/0300993 A1 Oct. 13, 2016

Related U.S. Application Data

(60) Provisional application No. 61/912,151, filed on Dec. 5, 2013.

(51) Int. Cl.
*H01L 35/18* (2006.01)
*H01L 35/02* (2006.01)
*C22C 28/00* (2006.01)

(52) U.S. Cl.
CPC ............ *H01L 35/18* (2013.01); *C22C 28/00* (2013.01); *H01L 35/02* (2013.01)

(58) Field of Classification Search
None
See application file for complete search history.

(56) References Cited

U.S. PATENT DOCUMENTS

| 2004/0112418 A1 | 6/2004 | Yang et al. |
| 2005/0172994 A1* | 8/2005 | Shutoh .................. H01L 35/20 136/239 |

(Continued)

FOREIGN PATENT DOCUMENTS

| CN | 103314458 A | 9/2013 |
| JP | 2010-095688 A | 4/2010 |
| JP | 2012-124243 A | 6/2012 |

OTHER PUBLICATIONS

Ma et al. "Computational investigation of half-Heusler compounds for spintronics applications" Physical Review B 95, 024411 (2017) (Year: 2017).*

(Continued)

*Primary Examiner* — Magali P Slawski
(74) *Attorney, Agent, or Firm* — Maginot Moore & Beck LLP

(57) ABSTRACT

A thermoelectric power generation (TEG) unit configured to be integrated into the exhaust system of a vehicle includes a plurality of thermoelectric power generator modules, each comprising an electrically interconnected plurality of p-type and n-type thermoelectric material legs, each leg extending between a substrate on a hot side and a substrate on a cold side of the module, wherein the thermoelectric materials for the legs are half-Heusler compounds having a thermoelectric figure of merit (ZT) greater than 1.0.

8 Claims, 5 Drawing Sheets

(56) References Cited

U.S. PATENT DOCUMENTS

| | | | |
|---|---|---|---|
| 2008/0178920 A1* | 7/2008 | Ullo | E21B 47/011 136/204 |
| 2010/0147348 A1* | 6/2010 | Backhaus-Ricoult | B82Y 30/00 136/201 |
| 2010/0319746 A1 | 12/2010 | Snyder et al. | |
| 2012/0160290 A1 | 6/2012 | Chen et al. | |
| 2012/0326097 A1 | 12/2012 | Ren et al. | |
| 2013/0037071 A1* | 2/2013 | Gerster | H01L 35/08 136/203 |
| 2013/0175484 A1 | 7/2013 | Ren et al. | |

OTHER PUBLICATIONS

Young et al. "Thermoelectric properties of pure and doped FeMSb (M=V,Nb)" Journal of Applied Physics 87, 317 (2000) pp. 317-321 (Year: 2000).*

Hermet et al. "Lattice Thermal Conductivity of NiTiSn Half-Heusler Thermoelectric Materials from First-Principles Calculations" Journal of Alloys and Compounds 688, 248 (2016) (Year: 2016).*

Supplementary European Search Report corresponding to European Patent Application No. 14 88 4141 (1 page).

Yang, Jiong et al., "Evaluation of Half-Heusler Compounds as Thermoelectric Materials Based on the Calculated Electrical Transport Properties", Advanced Functional Materials, vol. 18, No. 19, Oct. 9, 2008 (9 pages).

International Search Report corresponding to PCT Application No. PCT/US2014/068588, dated Sep. 15, 2015 (3 pages).

"Stronger phonon scattering by larger differences in atomic mass and size in p-type half-Heuslers Hf1-xTixCoSb0.8Sn0.2", Xiao Yan et al.

"Latice thermal conductivity of NiTiSn half-Heusler thermoelectric materials from first-principles calculations", Hernet et al. J. Alloys an Compounds, vol. 688, Part A, Dec. 15, 2016, pp. 248-252.

"Examining the thermal conductivity of half-Heusler alloy TiNiSn by first-principle calculations", Ding et al., Huazhong University of Science & Technology, Wuhan, CN.

English Translation of Chinese First Office Action corresponding to Chinese Patent Application No. 201480074877.3 (14 pages).

Sportouch, S. et al., "Observed Properties and Electronic Structure of RNiSb Compounds (R=Ho, Er, Tm, Yb and Y). Potential Thermoelectric Materials," Materials Research Society, vol. 545, pp. 421-433 (13 pages).

Sakurada, S. et al., "Effect of Ti substitution on the thermoelectric properties of (Zr, Hf)NiSn half-Heusler compounds," Applied Physics Letters, vol. 86, pp. 082105-1-082105-3, 2005 (3 pages).

* cited by examiner

MATERIALS FOR THERMOELECTRIC ENERGY CONVERSION

REFERENCE TO RELATED APPLICATION AND PRIORITY CLAIM

This application is a 35 U.S.C. § 371 National Stage Application of PCT/US2014/068588, filed on Dec. 4, 2014, which claims the benefit of priority to U.S. Provisional Application No. 61/912,151, filed on Dec. 5, 2013 and entitled "Materials for Thermoelectric Energy Conversion," the entire disclosures of which are each incorporated herein by reference.

STATEMENT OF GOVERNMENT INTEREST

This invention was made with government support under grant DE-EE0004840 awarded by the U.S. Department Of Energy. The government has certain rights in the invention.

BACKGROUND

The present disclosure relates to thermoelectric generators (TEGs), and particularly TEGs for use in motor vehicles.

Fuel efficiency of motor vehicles can be improved by integrating a thermoelectric generator (TEG) in the exhaust system. The TEG converts waste heat from the internal combustion engine into electricity using the Seebeck Effect. The typical TEG includes a hot-side heat exchanger, a cold-side heat exchanger, thermoelectric materials and a compression assembly. The heat exchangers are typically in the form of metal plates with high thermal conductivity. The temperature difference between the two surfaces of the thermoelectric module(s) generates electricity using the Seebeck Effect. When hot exhaust from the engine passes through the TEG, the charge carriers of the semiconductors within the generator diffuse from the hot-side heat exchanger to the cold-side exchanger. The build-up of charge carriers results in a net charge, producing an electrostatic potential Va (FIG. 2) while the heat transfer drives a current. With exhaust temperatures of 700° C. (~1300° F.) or more, the temperature difference between exhaust gas on the hot side and coolant on the cold side is several hundred degrees. In certain automotive TEGs, this temperature difference is capable of generating 500-750 W of electricity.

The compression assembly aims to decrease the thermal contact resistance between the thermoelectric module and the heat exchanger surfaces. In coolant-based automotive TEGs, the cold side heat exchanger uses engine coolant as the cooling fluid, while in exhaust-based TEGs, the cold-side heat exchanger uses ambient air as the cooling fluid.

By way of example vehicle exhaust system 10, shown in the generalized schematic of FIG. 1, includes an exhaust pipe 12 that directs heated exhaust gases from an internal combustion engine 14 to an exhaust system outlet 16, such as a tailpipe for example. The exhaust system 10 may include additional exhaust components positioned between the engine 14 and the outlet 16, such as mufflers, resonators, catalysts, etc. A TEG 20 is incorporated into the exhaust system and in particular integrated into the exhaust pipe 12 to transform heat generated by exhaust gases into electrical energy/power. The TEG 20 can store this generated electrical energy in a storage device S, such as a rechargeable battery and/or may provide the electrical energy to various vehicle systems $VS_1$-$VS_n$ as needed. The vehicle systems $VS_1$-$VS_n$ may include engine controls, exhaust system controls, a door lock system, window lifting mechanism, interior lighting, etc. A controller 22 may be provided to control the storage and usage of the electrical energy generated by the TEG 20.

In one example, the thermoelectric unit 20 is constructed from at least one of semi-conductor and semi-metal materials that have specific upper and lower temperature limits of efficient operation. Exposure to excessively high exhaust gas temperatures over this upper limit can damage these materials, and exhaust gas temperatures that are below the lower limit can result in ineffective electrical power generation. Consequently, in prior systems it has been necessary to include a temperature control device 30 positioned in the exhaust pipe 12 upstream of the TEG 20. The temperature control device 30 can be in the form of a cooling device 30a that cools heated exhaust gases to temperatures within a specified temperature range that is between the upper and lower temperature limits of materials used to construct the TEG 20. These cooled exhaust gases are then communicated to an inlet 32 to the thermoelectric unit 20. The exhaust gases pass through the TEG 20, waste heat from the exhaust gases is transformed into electrical energy, and then the gases exit the thermoelectric unit 20 via an outlet 34. This configuration comprises a non-bypass arrangement in which all of the exhaust gases flow through the thermoelectric unit 20.

The cooling device 30a can include many different types of cooling components. For example, the cooling device 30a could be a fluid cooled heat exchanger, or could include air or water injection for cooling. Optionally, the cooling device 30a could comprise an air gap pipe combined with air injection or forced air cooling, which can provide both cooling and a potential reduction in thermal inertia to avoid faster heat up. The cooling device 30a may be configured to incorporate the function of the compression assembly discussed above, in particular by directing coolant or cooling effects to the cold-side heat exchanger of the TEG 20.

The key components of the TEG are the thermoelectric (TE) modules which convert the heat flux into electric power. The generalized configuration and operation of a typical TE module 50 is depicted in the diagram of FIG. 2. The thermoelectric module 50 includes alternating n-type and p-type semiconductor legs, 52 and 54, respectively, that are electrically connected 56 in series. The legs and electrical connections may be sandwiched between a cold side substrate 60 and a hot side substrate 61 within the TEG unit 20. The temperature gradient drives the electric current 58 in each leg according to the Seebeck effect, $E_{emf}=-s \nabla T$, where S is the Seebeck coefficient which is a property of the local material, and $\nabla T$ is the temperature gradient across the semiconductor legs).

The efficiency of heat to electricity conversion is a material property characterized by dimensionless figure of merit ZT:

$ZT=\sigma S^2 T/(\kappa_{el}+\kappa_{lat})$, where $\sigma$ is the electrical conductivity, S is the Seebeck coefficient, T is temperature, $\kappa_{el}$ is the electronic thermal conductivity, and $\kappa_{lat}$ is the lattice thermal conductivity.

SUMMARY

The present disclosure contemplates a thermoelectric power generation (TEG) unit configured to be integrated into the exhaust system of a vehicle which includes a plurality of thermoelectric power generator modules, each comprising an electrically interconnected plurality of p-type and n-type thermoelectric material legs, each leg extending between a substrate on a hot side and a substrate on a cold side of the module, wherein the thermoelectric materials for the legs are half-Heusler compounds having a thermoelectric figure of merit (ZT) greater than 1.0. In one aspect, the thermoelectric materials for the legs may have a doping level of less than 0.005 electrons or holes per unit cell.

According to one feature, the thermoelectric material for the p-type legs is selected from the group of half-Heusler compounds including YNiSb, YNiBi, LaNiSb and LaNiBi. In another feature, the thermoelectric material for the n-type legs is selected from the group of half-Heusler compounds including NbFeSb, VCoSn and TaFeSb. The doping of the p-type and n-type compounds can be optimized by replacing part of the compound components with certain elements or alloys.

DETAILED DESCRIPTION

Figure 1:
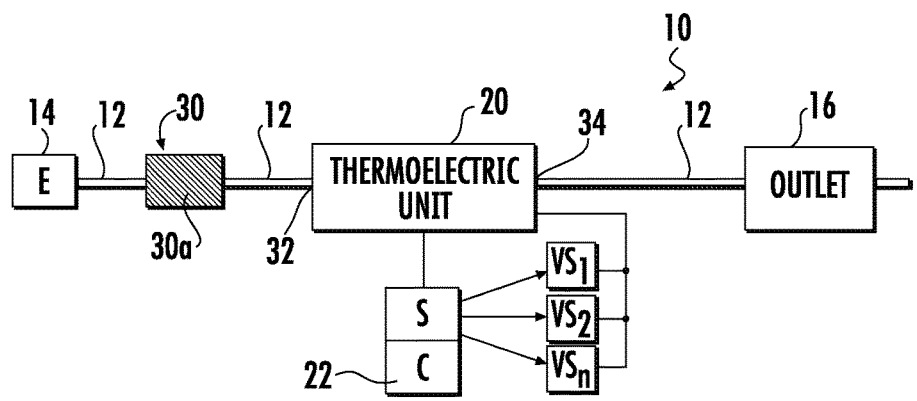
FIG. 1 is a schematic diagram of a vehicle exhaust system incorporating a thermoelectric generator (TEG).

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure encompasses any alterations and modifications to the illustrated embodiments and includes further applications of the principles of the disclosure as would normally occur to one skilled in the art to which this disclosure pertains.

Traditional TE materials such as BiTe (Bismuth-Tellurium) have low operating temperatures limiting their use in automotive applications and/or requiring devices to cool the exhaust stream. Several classes of TE materials that deliver high performance over a broad temperature range have been discovered in recent years. Among these materials are some half-Heusler (HH) compounds which are predominantly n-type materials with two groups composed of transition metals and a third group composed of metals and metalloids. However, the ZT values for the investigated HH compounds are questionable and the compositional space of HH compounds has not been fully explored to date. Quantum mechanical simulations can be used to calculate the ZT values for many different HH compounds and to identify novel HH compounds with potential for use in TEG.

Eighty-eight ternary compounds have been reported in various materials databases to have HH type structure, as summarized in the review in Reference [1] identified in the Appendix. HH compounds of interest were selected based on the following two criteria: 1) materials which are comprised of cheap earth-abundant elements; and 2) materials which are semiconductors. The latter condition is satisfied by selecting those compounds which have eighteen valence electrons per formula unit, as described in Reference [2] identified in the Appendix. Application of the second condition narrows down the list from eighty-eight to fifteen HH compounds. In addition, thirteen hypothetical compounds have been identified by replacing chemical elements in the fifteen existing HH compounds with the other elements of the same group and similar covalent radii. The complete list of twenty-eight HH compounds (fifteen existing and thirteen hypothetical as designated by a (?)) is shown in Table 1 below.

TABLE 1

| YNiSb | TiCoSb | ZrCoSb | HfCoSb | VFeSb | NbFeSb | TaFeSb (?) |
|---|---|---|---|---|---|---|
| YNiBi | TiCoBi (?) | ZrCoBi | HfCoBi | VFeBi (?) | NbFeBi (?) | TaFeBi (?) |
| LaNiSb | TiNiSn | ZrNiSn | HfNiSn | VCoSn (?) | NbCoSn | TaCoSn (?) |
| LaNiBi | TiNiPb (?) | ZrNiPb (?) | HfNiPb (?) | VCoPb (?) | NbCoPb (?) | TaCoPb (?) |

The electronic transport coefficients for the twenty-eight HH compounds listed in Table 1 can be calculated by solving the Boltzmann transport equation (BTE) for electrons under the single mode relaxation time approximation (SMTRA) with the help of BoltzTraP program. See, Reference [3]. These calculations require as input the electronic band structure and the electron relaxation time τ which is a central quantity in the BTE theory. The electronic band structure is typically computed using density functional theory (DFT), while τ is assumed to be a constant (independent of electron energy, chemical potential μ, and temperature T). The DFT method, although fast and robust, is known to underestimate the electronic band gaps of semiconductors. Consequently, a more accurate (but computationally more expensive) method for computing the band structures can be utilized, known as the GW method. The DFT and GW calculations performed for six HH compounds selected from Table 1 using Quantum ESPRESSO (see, Reference [4]) and Berkeley G W (see Reference [5]) packages, respectively, yield the calculated band gaps (in eV) shown in Table 2 below:

TABLE 2

|  | TiNiSn | ZrNiSn | HfNiSn | TiCoSb | ZrCoSb | HfCoSb |
|---|---|---|---|---|---|---|
| DFT | 0.47 | 0.53 | 0.42 | 1.12 | 1.08 | 1.14 |
| GW | 0.53 | 0.50 | 0.38 | 1.17 | 1.26 | 1.18 |

The similarity between the DFT and GW numbers in Table 2 suggests that for HH compounds, in contrast to most semiconductors, DFT is able to accurately predict band structures. Consequently, the DFT method was used for the band structure calculations of the remaining twenty-two HH compounds in Table 1.

At the high temperatures typical of TEG operation, the main contribution to τ comes from electron-phonon scattering. An ab initio formulation of the electron-phonon interaction can be applied as outlined in Reference [6] identified in the Appendix, and followed by an EPA (electron-phonon averaged) approximation. According to Reference [6], the inverse τ is expressed in terms of the electron-phonon interaction matrix elements, the electron and phonon occupation numbers, and the electronic density of states. Under the EPA approximation, the electron-phonon interaction matrix elements are calculated within density functional perturbation theory (DFPT) using Quantum ESPRESSO package (Reference [4]), averaged over the electron and phonon momenta, and then these averaged quantities are used in computing the inverse τ according to the formulation of Reference [6]. The calculated τ is fed into the BTE for electrons which is then solved to compute the electrical conductivity σ, the electronic thermal conductivity $\kappa_{el}$, and the Seebeck coefficient S. The remaining quantity entering the expression for ZT, the lattice thermal conductivity $\kappa_{lat}$, can be calculated by solving the BTE for phonons. However, previous efforts on optimization of TE materials have shown that $\kappa_{lat}$ for HH compounds can be greatly reduced from its crystalline value by alloying (mass disorder) and nanostructuring. See, References [7,8]. Therefore, the value for $\kappa_{lat}$ is set to 2.2 W/(m K), which is an average of the values of $\kappa_{lat}$ for two optimized compounds, n-type $Hf_{0.75}Zr_{0.25}NiSn_{0.99}Sb_{0.01}$ and p-type $Hf_{0.8}Ti_{0.2}CoSb_{0.8}Sn_{0.2}$, measured at T=400° C. See, References [7,8].

Figure 3:
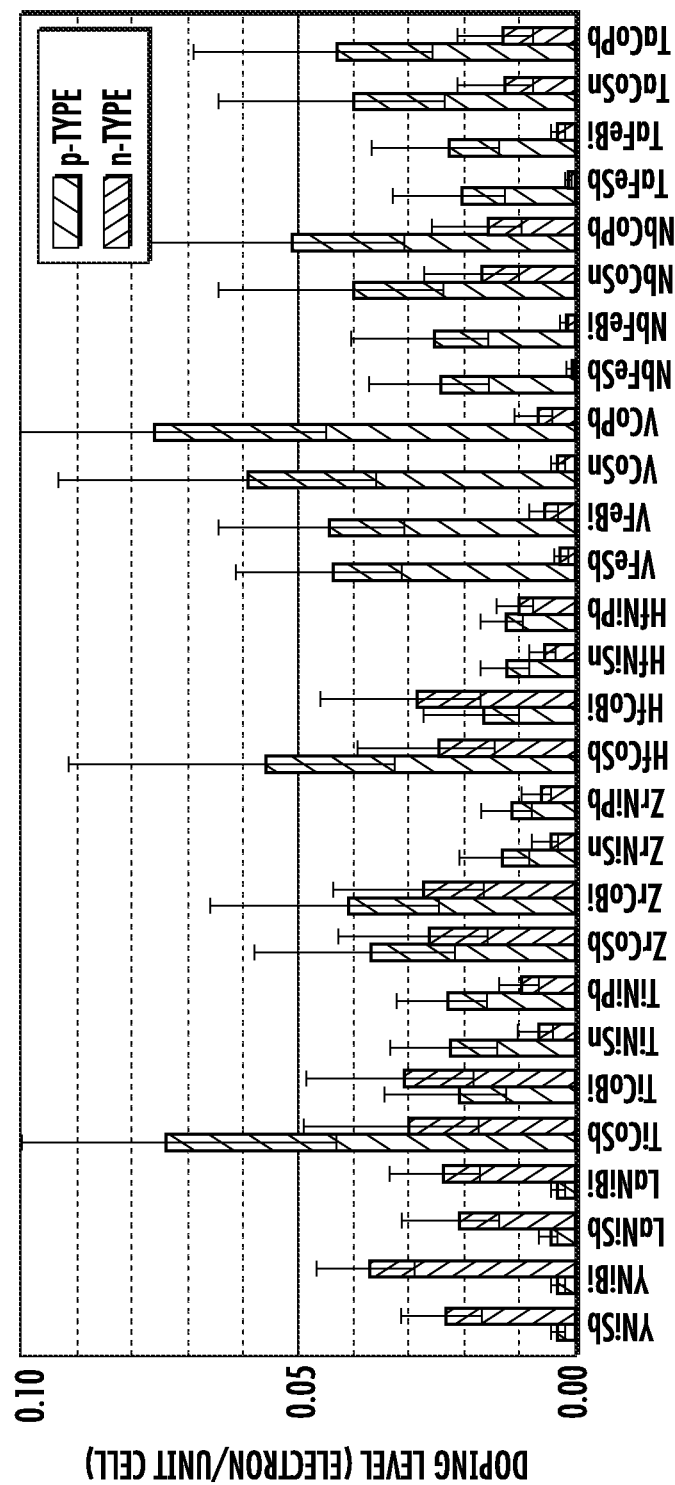
FIG. 3 is a chart of optimal doping levels in units of holes and electrons per unit cell for 28 HH compounds in the p-type and n-type regions at T=400° C. The error bars correspond to the range of ZT values within 5% of the maximum ZT.

The electronic transport coefficients and ZT values for the twenty-eight HH compounds in Table 1 can be computed as functions of the chemical potential μ at the average operating temperature T=400° C. For each HH compound, the ZT vs. μ curve shows two maxima occurring when μ is near the valence band maximum (VBM) and near the conduction band minimum (CBM). These two values of μ correspond to the optimal doping levels in the p-type and n-type regions, respectively. The resulting optimal doping levels are shown in the chart of FIG. 3. These doping levels are not identical to the dopant concentrations for these compounds because of the intrinsic defects responsible for self-doping. For instance, intrinsic ZrCoSb and TiNiSn compounds are n-type materials with self-doping levels of about 0.1 electrons per unit cell. See, References [9,10]. Nevertheless there is a correlation between the doping levels and the dopant concentrations: the optimal doping levels for n-type (Ti, Zr, Hf)NiSn are about 0.005 electron/unit cell and for p-type (Ti, Zr, Hf)CoSb about 0.055 hole/unit cell, according to FIG. 3, while the optimal dopant concentrations for these materials are x=0.01 and x=0.2, respectively (see, References [7,8]).

Figure 4:
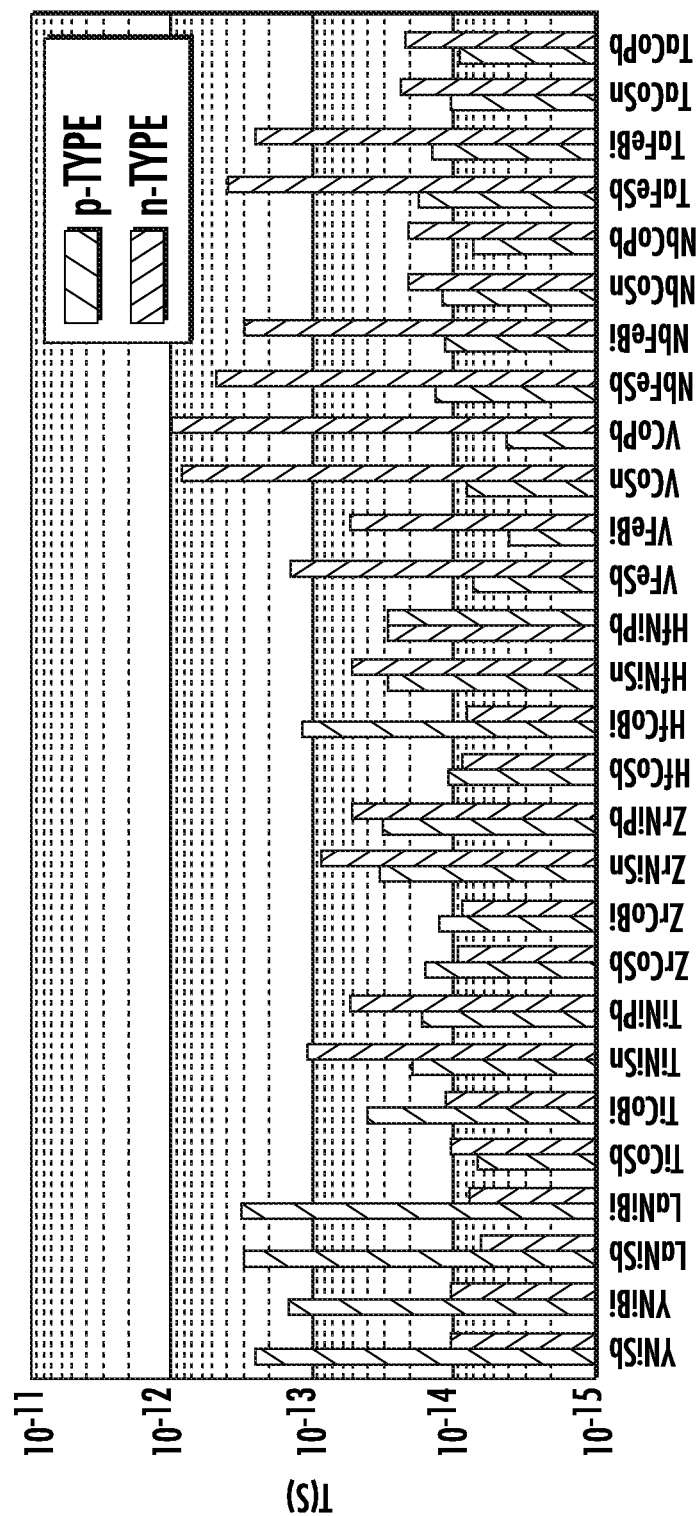
FIG. 4 is a chart of electron relaxation times T for an electron at energy $\mu \mp k_B T$ in the optimally doped p-type and n-type HH compounds from FIG. 3 at T=400° C.

For illustrative purposes, FIG. 4 plots the values of τ for an electron at energy $\mu \mp k_B T$ (where $k_B$ is the Boltzmann constant) in the optimally doped p-type and n-type HH compounds at T=400° C. As shown in FIG. 4, τ varies over more than two orders of magnitude for different HH compounds or for the same HH compound doped p-type or n-type. This suggests that the constant τ approximation widely used in the literature is inadequate for HH compounds (and for semiconductor materials in general).

Figure 5:
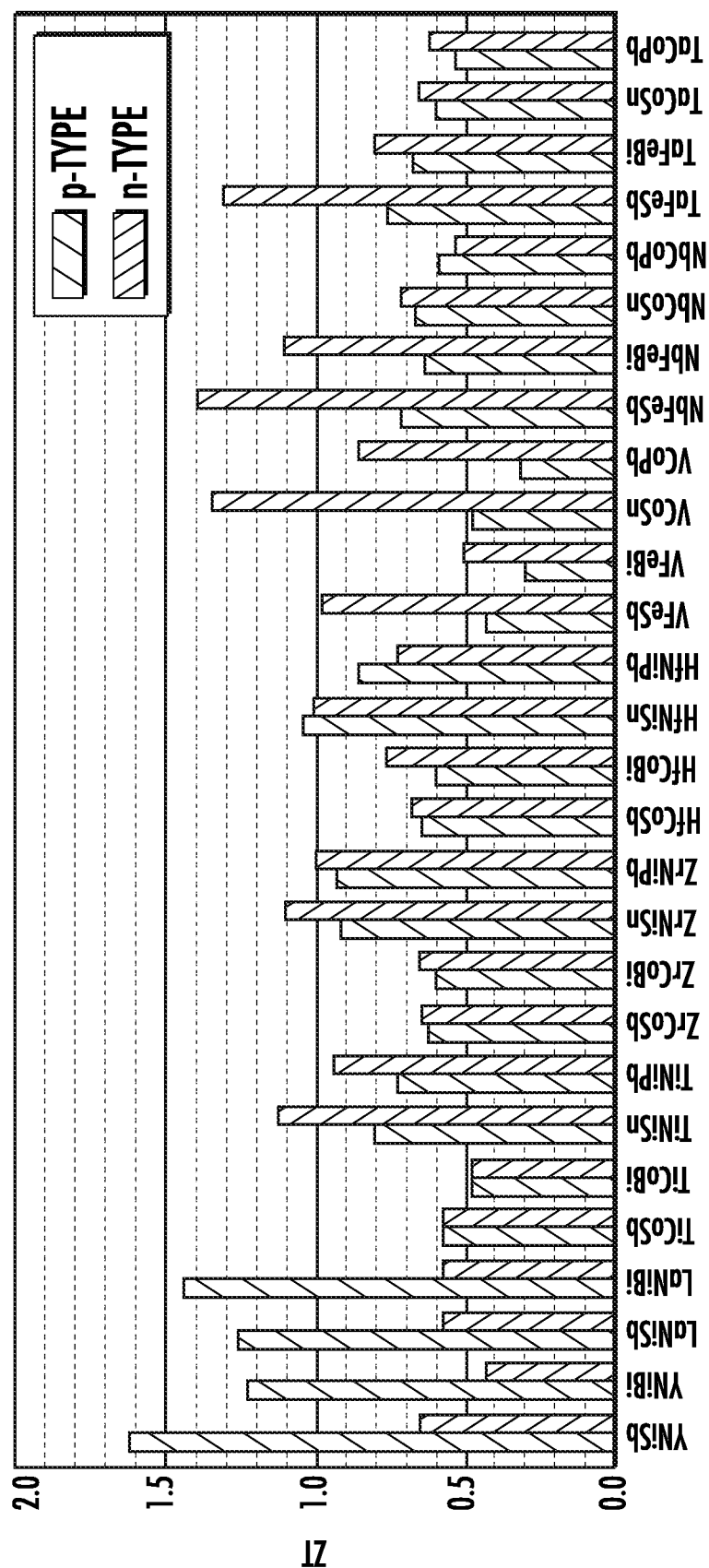
FIG. 5 is a chart of the figure of merit, ZT, in the optimally doped p-type and n-type HH compounds from FIG. 3 at T=400° C.

FIG. 5 shows the values of ZT for the optimally doped p-type and n-type HH compounds at T=400° C. Analyzing the data shown in FIG. 5 reveals that (Ti, Zr, Hf)NiSn compounds have one of the highest ZT values among n-type HH materials. This result is consistent with the experimentally optimized n-type (Ti, Zr, Hf)NiSn compound. See, Reference [7]. However, the calculations identify four n-type compounds (one existing and three hypothetical) which show larger ZT values than those of (Ti, Zr, Hf)NiSn. These compounds include existing compound NbFeSb and theoretical compounds VCoSn, TaFeSb, and NbFeBi. According to the calculations, p-type (Ti, Zr, Hf)CoSb compounds show moderate ZT values compared to n-type (Ti, Zr, Hf)NiSn. This observation is again consistent with experimental data. See, Reference [8]. The calculations identify four p-type compounds (all existing) with larger ZT values than those of (Ti, Zr, Hf)CoSb, namely YNiSb, LaNiBi, LaNiSb, and YNiBi.

Figure 6:
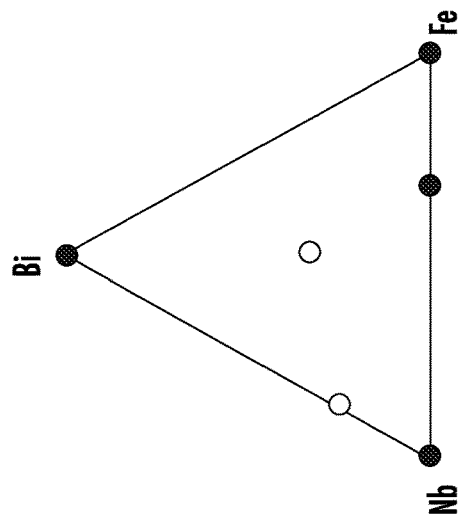
FIG. 6 are calculated phase diagrams of ternary systems V—Co—Sn, Ta—Fe—Sb, and Nb—Fe—Bi, with solid dots denoting stable compounds and open dots denoting unstable compounds.
Figure 6:
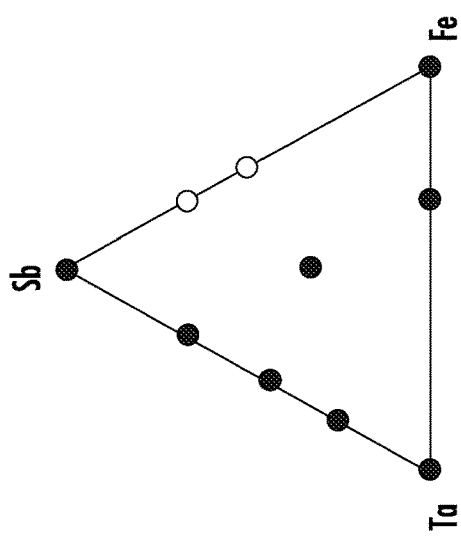
Figure 6:
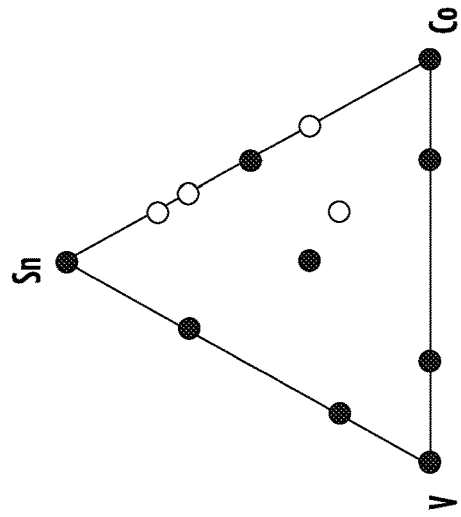

Three hypothetical HH compounds can be identified as promising n-type materials: VCoSn, TaFeSb, and NbFeBi. To check the stability of these hypothetical compounds, their energies can be calculated as well as the energies of all known compounds in the ternary systems V—Co—Sn, Ta—Fe—Sb, and Nb—Fe—Bi. The Convex Hull is constructed in the ternary space of each hypothetical compound. The resulting ternary phase diagrams are shown in FIG. 6 where the stable and unstable compounds (inside and outside the Convex Hull) are indicated by solid (stable) and open (unstable) dots. The hypothetical compounds of interest are represented by the dots in the centers of the triangles. As shown in FIG. 6, VCoSn and TaFeSb are stable while NbFeBi is unstable. The Convex Hull analysis predicts that the formation energies of VCoSn and TaFeSb are 1 meV/atom and 68 meV/atom, respectively, while the formation energy of NbFeBi is −197 meV/atom. Fortunately, the unstable NbFeBi compound has the lowest ZT value among the three hypothetical compounds as shown in FIG. 5.

The maximum ZT values and the optimal doping levels for the seven suggested HH compounds (four p-type and three n-type) are shown in Table 3 below. To achieve the ZT values listed in Table 3, these compounds should be doped to the optimal levels, and their lattice thermal conductivity should be reduced to $\kappa_{lat}$=2.2 W/(m K) by alloying (mass disorder) and nanostructuring. For the compounds listed in the left half of Table 3, the p-type doping can be achieved by replacing part of Y or La with Mg, Ca, Sr, or Ba; part of Ni with Co; and part of Sb or Bi with C, Si, Ge, Sn, or Pb. For the compounds listed in the right half of Table 3, the n-type doping can be achieved by replacing part of V, Nb, or Ta with Ti, Zr, or Hf; part of Fe with Mn; part of Co with Fe; part of Sn with B, Al, Ga, or In; and part of Sb with C, Si, Ge, Sn, or Pb. For the compounds listed in Table 3, the mass disorder can be achieved by alloying of Y, La, and lanthanides; alloying of V, Nb, and Ta; alloying of Sn, C, Si, Ge, and Pb; and alloying of Sb, Bi, N, P, and As.

TABLE 3

| p-type | | | n-type | | |
|---|---|---|---|---|---|
| compound | ZT | doping | compound | ZT | doping |
| YNiSb | 1.61 | 0.003 | NbFeSb | 1.40 | 0.001 |
| LaNiBi | 1.44 | 0.003 | VCoSn | 1.34 | 0.003 |
| LaNiSb | 1.26 | 0.004 | TaFeSb | 1.31 | 0.001 |
| YNiBi | 1.22 | 0.003 | | | |

Figure 2:
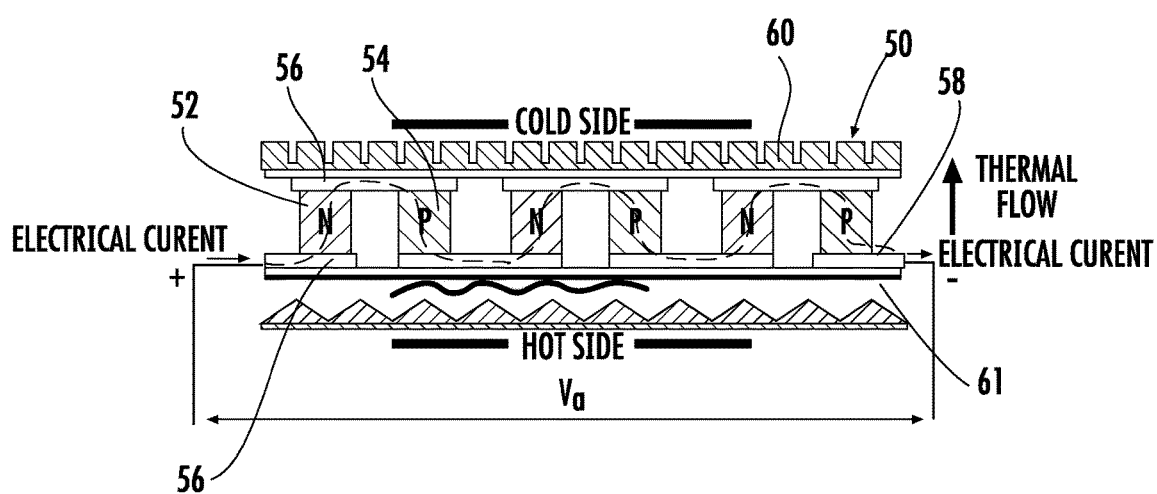
FIG. 2 is a diagram of a thermoelectric unit (TE) of a TEG such as shown in FIG. 1.

In one aspect of the present disclosure, the p-type and n-type HH compounds identified in Table 3 are used as the TE materials for the semiconductor legs 52, 54 of the TE modules 50 (see FIG. 2) incorporated into a TEG unit 20 (FIG. 1). The HH compounds are selected as a function of stability, high ZT, and a lattice thermal conductivity of less than or about 2.2 W/(mK).

The doping of the p-type compounds may be optimized by replacing part of the Yttrium or Lanthanum component with an alkaline earth metal, replacing part of the Nickel with Cobalt, and/or replacing part of the Antimony or Bismuth with a non-metal or a base metal.

The doping of the n-type compounds may be optimized by replacing part of the 5B transition metal with a 4B transition metal, replacing part of the Iron with Manganese or part of the Cobalt with Iron, and/or replacing part of the Tin with a Series 3A element or part of the Antimony with a Series 4A element.

In another aspect, the mass disorder of the compounds in Table 3 can be achieved by alloying the Yttrium and lanthanides, alloying the 5B transition metals, alloying the Series 4A elements and alloying the Series 5A elements.

The present disclosure should be considered as illustrative and not restrictive in character. It is understood that only certain embodiments have been presented and that all changes, modifications and further applications that come within the spirit of the disclosure are desired to be protected.

APPENDIX

The following references are cited in the specification and are incorporated herein by reference.
[1] Winnie Wong-Ng and J. Yang, "International Centre for Diffraction Data and American Society for Metals database survey of thermoelectric half-Heusler material systems." *Powder Diffraction*, vol. 28, no. 1, p. 32, 2013.
[2] B. R. K. Nanda and I. Dasgupta, "Electronic structure and magnetism in half-Heusler compounds." *Journal of Physics: Condensed Matter*, vol. 15, no. 43, p. 7307, 2003.
[3] Georg K. H. Madsen and David J. Singh, "BoltzTraP. A code for calculating band-structure dependent quantities." *Computer Physics Communications*, vol. 175, no. 1, p. 67, 2006.
[4] P. Giannozzi, S. Baroni, N. Bonini, M. Calandra, R. Car, C. Cavazzoni, D. Ceresoli, G. L. Chiarotti, M. Cococcioni, I. Dabo, A. Dal Corso, S. de Gironcoli, S. Fabris, G. Fratesi, R. Gebauer, U. Gerstmann, C. Gougoussis, A. Kokalj, M. Lazzeri, L. Martin-Samos, N. Marzari, F. Mauri, R. Mazzarello, S. Paolini, A. Pasquarello, L. Paulatto, C. Sbraccia, S. Scandolo, G. Sclauzero, A.P. Seitsonen, A. Smogunov, P. Umari, and R.M. Wentzcovitch, "QUANTUM ESPRESSO: a modular and open-source software project for quantum simulations of materials." *Journal of Physics: Condensed Matter*, vol. 21, no. 39, p. 395502, 2009.
[5] J. Deslippe, G. Samsonidze, D. A. Strubbe, M. Jain, M. L. Cohen, and S. G. Louie, "Berkeley G W: A Massively Parallel Computer Package for the Calculation of the Quasiparticle and Optical Properties of Materials and Nanostructures." *Computer Physics Communication*, vol. 183, no. 6, p. 1269, 2012.
[6] G. Grimvall, "The Electron-Phonon Interaction in Normal Metals." *Physica Scripta*, vol. 14, no. 1-2, p. 63, 1976.
[7] Giri Joshi, Xiao Yan, Hengzhi Wang, Weishu Liu, Gang Chen, and Zhifeng Ren, "Enhancement in Thermoelectric Figure-Of-Merit of an N-Type Half-Heusler Compound by the Nanocomposite Approach." *Advanced Energy Materials*, vol. 1, no. 4, p. 643, 2011.
[8] Xiao Yan, Weishu Liu, Hui Wang, Shuo Chen, Junichiro Shiomi, Keivan Esfarjani, Hengzhi Wang, Dezhi Wang, Gang Chen, and Zhifeng Ren, "Stronger phonon scattering by larger differences in atomic mass and size in p-type half-Heuslers $Hf_{1-x}Ti_xCoSb_{0.8}Sn_{0.2}$." *Energy & Environmental Science*, vol. 5, no. 6, p. 7543, 2012.
[9] Y. Xia, S. Bhattacharya, V. Ponnambalam, A. L. Pope, S. J. Poon, and T. M. Tritt, "Thermoelectric properties of semimetallic (Zr,Hf)CoSb half-Heusler phases." *Journal of Applied Physics*, vol. 88, no. 4, p. 1952, 2000.
[10] Siham Ouardi, Gerhard H. Fecher, Benjamin Balke, Xenia Kozina, Gregory Stryganyuk, Claudia Felser, Stephan Lowitzer, Diemo Kodderitzsch, Hubert Ebert, and Eiji Ikenaga, "Electronic transport properties of electron- and hole-doped semiconducting $C_{1_b}$ Heusler compounds: $NiTi_{1-x}M_xSn$ (M=Sc, V)." *Physical Review B*, vol. 82, no. 8, p. 085108, 2010.

What is claimed is:

1. A thermoelectric power generator module comprising:
a substrate on a hot side of the module;
a substrate on a cold side of the module; and
an electrically interconnected plurality thermoelectric material legs, each of said plurality of legs extending between said substrate on the hot side and said substrate on said cold side of the module,
wherein said plurality of legs includes a like number of p-type legs and n-type legs, and
wherein the thermoelectric material for each of said like number of p-type legs is selected from the group of half-Heusler compounds YNiSb, YNiBi, LaNiSb and LaNiBi, and has a doping level of less than 0.005 holes per unit cell;
wherein the thermoelectric material for each of said like number of n-type legs is selected from the group of half-Heusler compounds NbFeSb, VCoSn and TaFeSb, and has a doping level of less than 0.005 electrons per unit cell, and
the half-Heusler compounds of said plurality of legs have a thermoelectric figure of merit (ZT) greater than 1.0 and a lattice thermal conductivity of no greater than 2.2 W/(mK) measured at 400° C.

2. The thermoelectric power generator module of claim 1, wherein the doping of the compounds for the p-type legs is optimized by replacing part of the Yttrium or Lanthanum component with an alkaline earth metal, replacing part of the Nickel with Cobalt, and/or replacing part of the Antimony or Bismuth with a non-metal, a semi-metal or a base metal.

3. The thermoelectric power generator module of claim 2, wherein the alkaline earth metal is selected from Magnesium, Calcium, Strontium and Barium.

4. The thermoelectric power generator module of claim 2, wherein the non-metal or base metal is selected from Carbon, Silicon, Germanium, Tin and Lead.

5. The thermoelectric power generator module of claim 1, wherein part of the 5B metal Niobium (Nb), Vanadium (V) or Tantalum (Ta) in the half-Heusler compounds is replaced by a 4B transition metal selected from the group including Titanium, Zirconium and Hafnium.

6. The thermoelectric power generator module of claim 1, wherein part of the tin (Sn) of the half-Heusler compounds is replaced by a Series 3A element selected from the group including Boron, Aluminum, Gallium and Indium.

7. The thermoelectric power generator module of claim 1, wherein part of the antimony (Sb) of the half-Heusler compounds is replaced by a Series 4A element elected from the group including Carbon, Silicon, Germanium, Tin and Lead.

8. A thermoelectric power generation (TEG) unit configured to be integrated into the exhaust system of a vehicle, the TEG unit including a plurality of thermoelectric power generator modules according to claim 1.

* * * * *